United States Patent
Nelson et al.

(10) Patent No.: US 10,168,435 B2
(45) Date of Patent: Jan. 1, 2019

(54) DEAD-TIME CORRECTION SYSTEM AND METHOD

(71) Applicant: THERMO EBERLINE LLC, Oakwood Village, OH (US)

(72) Inventors: Greg Holger Nelson, Ithaca, NY (US); Phillip Edward Beeson, Dorset (GB); Alan John Laing, Dorset (GB)

(73) Assignee: THERMO EBERLINE LLC, Oakwood Village, OH (US)

( * ) Notice: Subject to any disclaimer, the term of this patent is extended or adjusted under 35 U.S.C. 154(b) by 25 days.

(21) Appl. No.: 15/430,894

(22) Filed: Feb. 13, 2017

(65) Prior Publication Data
US 2017/0248704 A1    Aug. 31, 2017

Related U.S. Application Data

(60) Provisional application No. 62/300,257, filed on Feb. 26, 2016.

(51) Int. Cl.
*G01T 1/15* (2006.01)
*H03K 3/012* (2006.01)
(Continued)

(52) U.S. Cl.
CPC ............... *G01T 1/15* (2013.01); *G01T 1/171* (2013.01); *H03K 3/012* (2013.01); *H03K 21/14* (2013.01)

(58) Field of Classification Search
CPC .................... G01T 1/15; H03K 3/012
See application file for complete search history.

(56) References Cited

U.S. PATENT DOCUMENTS 4,491,733 A * 1/1985 Wasserman ............. G01T 1/171
                                                        250/374
6,470,295 B1 * 10/2002 Mirow ..................... G01D 1/08
                                                        702/176
(Continued)

FOREIGN PATENT DOCUMENTS

CN       203069745 U    7/2013
CN       104296727 A    1/2015
(Continued)

OTHER PUBLICATIONS

Harms, "Automatic Dead-time Correction for Multichannel Pulse-Height Analyzers at Variable Counting Rates," Nuclear Instruments and Method, 53, 192-196, 1967.

*Primary Examiner* — Michael C Bryant
(74) *Attorney, Agent, or Firm* — William R. McCarthy, III

(57) ABSTRACT

A system includes a pulse counter having a selectable pulse counter read-out rate, a pulse counter read-out (PCRO) storage register that stores a PCRO count, and a pulse-burst counter that has a pulse-burst counter read-out rate that is faster than all but the fastest selectable pulse counter read-out rate, a subtractor module in electronic communication with the pulse counter and the PCRO that subtracts the PCRO count from the pulse counter read-out count to output an uncorrected pulse count, a selection module in electronic communication with the pulse-burst counter that selects the pulse counter read-out rate in response to input from the pulse-burst counter, a multiplexer in electronic communication with the subtractor module and the selection module, the multiplexer selecting from among at least two dead-time correction transforms, the transform corresponding to the (Continued)

selected pulse counter read-out rate, and a control-and-readout module that outputs a dead-time corrected pulse rate.

25 Claims, 10 Drawing Sheets

(51) Int. Cl.
*H03K 21/14* (2006.01)
*G01T 1/17* (2006.01)

(56) References Cited

U.S. PATENT DOCUMENTS 9,008,969 B2 4/2015 Stoller et al.
2004/0251422 A1* 12/2004 Overhoff ................. G01T 1/185
250/376

FOREIGN PATENT DOCUMENTS

| CN | 104639309 A | 5/2015 |
| CN | 105159057 A | 12/2015 |
| WO | 2008020379 A2 | 2/2008 |

* cited by examiner

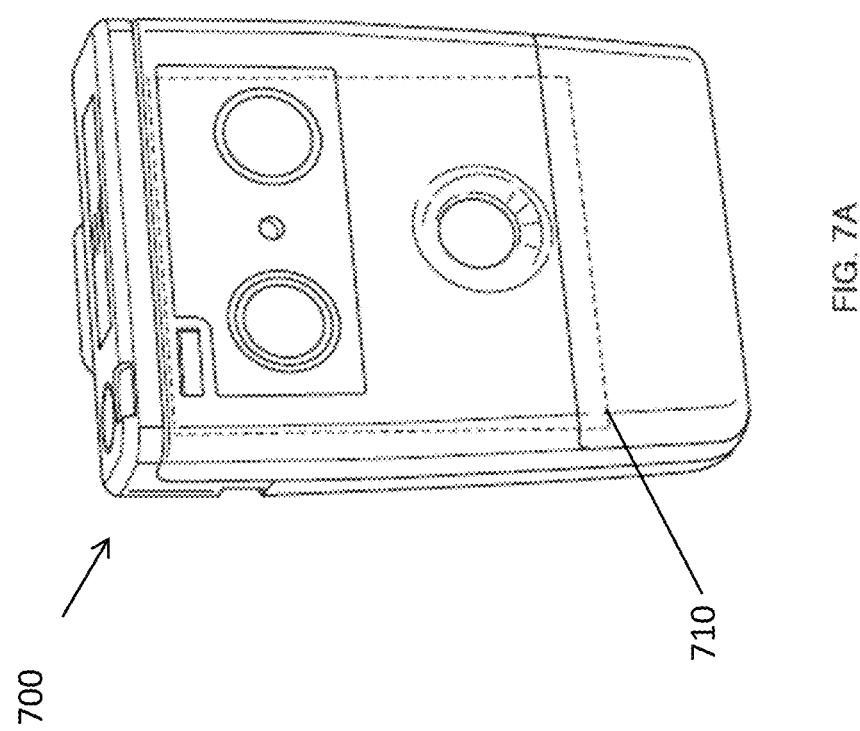

DEAD-TIME CORRECTION SYSTEM AND METHOD

CROSS-REFERENCE TO RELATED APPLICATION

This application claims the benefit of U.S. provisional patent application No. 62/300,257, filed Feb. 26, 2016. The contents of this application are incorporated herein by reference in its entirety.

FIELD OF THE INVENTION

The present invention is generally directed to dead-time correction for a pulse rate measurement device.

BACKGROUND

Quantitative pulse measurement devices (QPMDs) are deployed in numerous fields including the measurement of photons and particles (e.g., beta particles). QPMDs are typically provided with detectors which are capable of detecting events, such as the interaction of a photon or a particle with the detector, and producing a pulse which is to be measured. This pulse can require subsequent amplification before it is measured. When the pulse is measured, various properties of the pulse may be of use, including in particular the frequency of the pulses, yielding a count rate typically measured in counts per second (cps). Other properties of interest may include the pulse height, or the correlation of the pulse with other events.

When the measurement of count rates is of interest, QPMDs must generally deploy a "dead-time correction" (DTC) scheme. Dead-time correction is the adjustment of measured values to correct for measurements lost due to system processing time. There are many well-documented schemes for dead-time correction with varying degrees of accuracy by counting the amount of "elapsed dead time" (or its inverse, "elapsed live time") using high-speed clocks, with the accuracy limited by the duration of one clock cycle. However, high-speed clocks consume significant amounts of power. For a system that needs dead-time correction and low power consumption, such as a portable electronic dosimeter, an alternative approach is needed.

In addition, under uniform signal inputs (i.e., signal inputs that do not change with time), it is often possible to estimate the dead time correction with fair accuracy by knowing the relationship between the fixed signal input and the system performance. However, non-uniform signal inputs make this kind of estimation inaccurate in ways that cannot be predicted a priori.

Therefore, there is a need for a dead-time correction system and method that reduce or eliminate the problems described above.

SUMMARY

In one embodiment, a dead-time correction system for a pulse rate measurement device includes a first pulse counter having a selectable read-out rate, a second pulse counter operable at a read-out rate differing from that of the first pulse counter, a selection module in communication with the second pulse counter that selects the first pulse counter read-out rate in response to input from the second pulse counter, a multiplexer (MUX) in communication with the selection module, the MUX selecting from among at least two dead-time correction transforms (DTCT) based on the selected first pulse counter read-out rate, and a control-and-readout module in communication with the MUX that applies the selected DTCT to an uncorrected pulse count rate from the first pulse counter, to output a dead-time corrected pulse rate. The system can further include a first pulse counter read-out (PCRO) storage register that stores an immediately preceding PCRO count, and a subtractor module in communication with the first pulse counter and the PCRO storage register that subtracts the preceding PCRO count from the first pulse counter read-out count to output the uncorrected pulse count. The second pulse counter can have a read-out rate that is faster than all but the fastest selectable read-out rates of the first pulse counter.

In another embodiment, a dead-time correction system for a pulse rate measurement device includes a pulse counter that increments in response to pulses, the pulse counter having a selectable pulse counter read-out rate, a pulse counter read-out (PCRO) storage register that stores an immediately preceding PCRO count, and a pulse-burst counter that also increments in response to pulses, the pulse-burst counter having a pulse-burst counter read-out rate that is faster than all but the fastest selectable pulse counter read-out rate. The system further includes a subtractor module in electronic communication with the pulse counter and the PCRO storage register that subtracts the preceding PCRO count from the pulse counter read-out count to output an uncorrected pulse count, a selection module in electronic communication with the pulse-burst counter that selects the pulse counter read-out rate in response to input from the pulse-burst counter, a multiplexer (MUX) in electronic communication with the subtractor module and the selection module, the MUX selecting from among at least two dead-time correction transforms (DTCT), the DTCT corresponding to the selected pulse counter read-out rate, and a control-and-readout module in electronic communication with the MUX that applies the DTCT selected by the MUX to the uncorrected pulse count divided by the pulse counter read-out rate to output a dead-time corrected pulse rate. The system can further include an event sensor that generates a pulse in response to an event, the event sensor having a known dead-time per event. The event sensor can further include an amplifier and signal processing electronics. In some embodiments, the event sensor can comprise a semiconductor crystal. In other embodiments, the event sensor can comprise a scintillating crystal. In still other embodiments, the event sensor can comprise a photo-conversion device.

In certain embodiments, the selectable pulse counter read-out rate can be in a range of between 1 Hz and 1 kHz, and the pulse-burst counter read-out rate can be in a range of between 100 Hz and 10 kHz. In some embodiments, the selection module can select the pulse counter read-out rate in response to input from the pulse-burst counter and input from the control-and-readout module.

The DTCT can be one of an equation and a look-up table (LUT), wherein the equation can be a function of the uncorrected pulse count supplied by the subtractor, and the LUT can be one of a LUT that transforms output count rate into input count rate with interpolation between table entries, a LUT that provides a conversion constant for each output count rate, with interpolation between table entries, and a LUT that enumerates a complete set of output count rates and corresponding input count rates.

In some embodiments, the pulse counter, pulse-burst counter, and selection module can be implemented in a field programmable gate array (FPGA). In certain embodiments, the PCRO storage register, subtractor module, MUX, DTCTs, and control-and-readout module can be implemented in a general purpose micro-controller unit (MCU). In some embodiments, the aforementioned elements implemented in an FPGA can be combined with the aforementioned elements implemented in an MCU. In certain embodiments, the pulse counter, pulse-burst counter, and selection module can be implemented in an application specific integrated circuit (ASIC). In some embodiments, all elements can be implemented in an FPGA. In other embodiments, all elements can be implemented in an MCU.

In another embodiment, a method of correcting for dead-time of a pulse rate measurement device includes operating at least a first and second pulse counters at different read-out rates, selecting a read-out rate of the first pulse counter in response to input from the second pulse counter, selecting from among at least two dead-time correction transforms (DTCT) based on the selected first pulse counter read-out rate, and applying the selected DTCT to an uncorrected pulse count rate from the first pulse counter, to output a dead-time corrected pulse rate. The method can include storing an immediately preceding read-out count from the first pulse counter, and subtracting the preceding pulse counter read-out count from the first pulse counter read-out count, to output the uncorrected pulse count. The second pulse counter can have a read-out rate that is faster than all but the fastest selectable read-out rates of the first pulse counter.

In yet another embodiment, a method of correcting for dead-time of a pulse rate measurement device includes selecting a pulse counter read-out rate for a pulse counter that increments in response to pulses, storing an immediately preceding read-out count from the pulse counter, providing a pulse-burst counter that also increments in response to pulses, the pulse-burst counter having a pulse-burst counter read-out rate that is faster than all but the fastest selectable pulse counter read-out rate, and subtracting the preceding pulse counter read-out count from the pulse counter read-out count to output an uncorrected pulse count. The method further includes selecting the pulse counter read-out rate in response to input from the pulse-burst counter, selecting from among at least two dead-time correction transforms (DTCT), the DTCT corresponding to the selected pulse counter read-out rate, and applying the DTCT to the uncorrected pulse count divided by the pulse counter read-out rate to output a dead-time corrected pulse rate. The method can further include generating a pulse in response to an event. The selectable pulse counter read-out rate can be in a range of between 1 Hz and 1 kHz. The pulse-burst counter read-out rate can be in a range of between 100 Hz and 10 kHz.

In still another embodiment, a dead-time correction system for a pulse rate measurement device includes a present pulse counter that increments in response to pulses, a delayed pulse counter in electronic communication with the present pulse counter, the delayed pulse counter capturing the immediately previous read-out from the present pulse counter delayed by a single clock cycle at the present pulse counter read-out rate which is faster than all but the fastest selectable delayed pulse counter read-out rate. The system further includes pulse counter read-out (PCRO) storage register in electronic communication with the delayed pulse counter, that stores the delayed pulse counter read-out at a selectable delayed pulse counter read-out rate. The system also includes a first subtractor module in electronic communication with the present pulse counter and the delayed pulse counter that outputs a difference between counts recorded by the present pulse counter and the delayed pulse counter, a selection module in electronic communication with the first subtractor module that selects a new delayed pulse counter read-out rate based on the difference, a second subtractor module in electronic communication with the delayed pulse counter and the PCRO storage register that subtracts the preceding PCRO storage register count from the delayed pulse counter read-out count to output an uncorrected pulse count, a multiplexer (MUX) in electronic communication with the delayed pulse counter and the selection module, the MUX selecting from among at least two dead-time correction transforms (DTCT), the DTCT corresponding to the selected delayed pulse counter read-out rate, and a control-and-readout module in electronic communication with the MUX that applies the DTCT selected by the MUX to the uncorrected pulse count divided by the selected delayed pulse counter read-out rate to output a dead-time corrected pulse rate. The system can further include an event sensor that generates a pulse in response to an event, the event sensor having a known dead-time per event. The event sensor can further include an amplifier and signal processing electronics. In some embodiments, the event sensor can comprise a semiconductor crystal. In other embodiments, the event sensor can comprise a scintillating crystal. In still other embodiments, the event sensor can comprise a photo-conversion device.

In certain embodiments, the selectable delayed pulse counter read-out rate can be in a range of between 1 Hz and 1 kHz, and the clock cycle for the present pulse counter can be in a range of between 100 Hz and 10 kHz. In some embodiments, the selection module can select the delayed pulse counter read-out rate in response to input from the first subtractor module and input from the control-and-readout module.

The DTCT can be one of an equation and a look-up table (LUT), wherein the equation can be a function of the uncorrected pulse count supplied by the second subtractor, and the LUT can be one of a LUT that transforms output count rate into input count rate with interpolation between table entries, a LUT that provides a conversion constant for each output count rate, with interpolation between table entries, and a LUT that enumerates a complete set of output count rates and corresponding input count rates.

In some embodiments, the present pulse counter, delayed counter, first subtractor module, and selection module can be implemented in a field programmable gate array (FPGA). In other embodiments, the PCRO storage register, second subtractor module, MUX, DTCTs, and control-and-readout module can be implemented in a general purpose microcontroller unit (MCU). In still other embodiments, the aforementioned elements implemented in an FPGA can be combined with the aforementioned elements implemented in an MCU. In certain embodiments, the present pulse counter, delayed pulse counter, first subtractor module, and selection module can be implemented in an application specific integrated circuit (ASIC). In some embodiments, all elements can be implemented in an FPGA. In other embodiments, all elements can be implemented in an MCU.

In yet another embodiment, a method of correcting for dead-time of a pulse rate measurement device includes providing a present pulse counter that increments in response to pulses, receiving a read-out from the present pulse counter delayed by a single clock cycle of the present pulse counter in a delayed pulse counter in electronic communication with the present pulse counter, receiving a read-out from the delayed pulse counter into a pulse counter read-out (PCRO) storage register at a selectable delayed pulse counter read-out rate, and obtaining a difference between counts recorded by the present pulse counter and the delayed pulse counter. The method further includes selecting a new delayed pulse counter read-out rate based on the difference, obtaining a difference between counts recorded by the PCRO storage register and the delayed pulse counter to output an uncorrected pulse count, selecting from among at least two dead-time correction transforms (DTCT), the DTCT corresponding to the selected delayed pulse counter read-out rate, and applying the DTCT to the uncorrected pulse count divided by the selected delayed pulse counter read-out rate to output a dead-time corrected pulse rate. The method can further include generating a pulse in response to an event. The selectable delayed pulse counter read-out rate can be in a range of between 1 Hz and 1 kHz, and the clock cycle for the present pulse counter can be in a range of between 100 Hz and 10 kHz.

In another embodiment, an electronic dosimeter includes a radiation detector that generates a pulse in response to a radiation detection event, the radiation detector having a known dead-time per radiation detection event, and a dead-time correction system as described above.

The invention has many advantages, including enabling dead-time correction with low power consumption.

BRIEF DESCRIPTION OF THE DRAWINGS

FIGS. 7A and 7B are schematic illustrations of an electronic dosimeter including an exemplary embodiment of a dead-time correction system.

Like reference numerals refer to corresponding parts throughout the several views of the drawings.

DETAILED DESCRIPTION OF EMBODIMENTS

Figure 1:
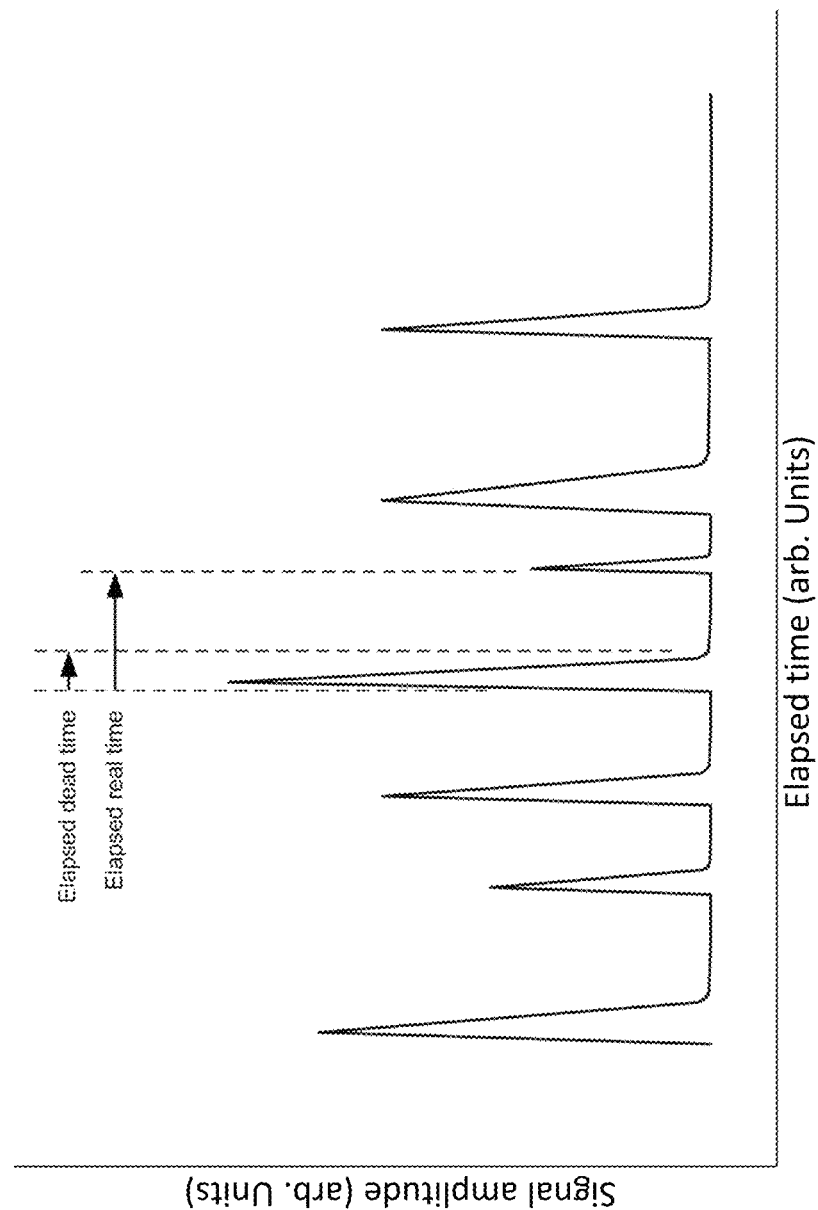
FIG. 1 is a graph of signal intensity as a function of elapsed time that illustrates dead-time in elapsed real time for a series of pulses.

In the description of the invention herein, it is understood that a word appearing in the singular encompasses its plural counterpart, and a word appearing in the plural encompasses its singular counterpart, unless implicitly or explicitly understood or stated otherwise. Furthermore, it is understood that for any given component or embodiment described herein, any of the possible candidates or alternatives listed for that component may generally be used individually or in combination with one another, unless implicitly or explicitly understood or stated otherwise. Moreover, it is to be appreciated that the figures, as shown herein, are not necessarily drawn to scale, wherein some of the elements may be drawn merely for clarity of the invention. Also, reference numerals may be repeated among the various figures to show corresponding or analogous elements. Additionally, it will be understood that any list of such candidates or alternatives is merely illustrative, not limiting, unless implicitly or explicitly understood or stated otherwise. In addition, unless otherwise indicated, numbers expressing durations, frequencies, quantities of ingredients, constituents, reaction conditions and so forth used in the specification and claims are to be understood as being modified by the term "about."

Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical values, however, inherently contain certain errors necessarily resulting from the standard deviation found in their respective testing measurements.

As described above, quantitative pulse measurement devices typically use a dead-time correction method to improve the accuracy of quantitative measurements based on the count rate of measured pulses. Quantitative pulse measurement devices are deployed in numerous fields including the measurement of photons and particles. Dead-time correction compensates for the fact that, due to physical limitations, the QPMD may be unable to process a subsequent pulse during the processing of an initial pulse. The duration of time during which such processing is precluded is called "dead-time" because the system is effectively "dead" to additional events during this time period. As seen in FIG. 1, if an additional pulse occurred during the dead-time interval, it would collide with the previous pulse (an event known as "pile-up") and would either be missed or inaccurately measured. This means that if the true count rate (often called input count rate or ICR) is known, and compared to the measured count rate (often called output count rate or OCR), the measured count rate will typically be less than the true count rate, with a discrepancy that increases with the true count rate. This is because, as can be seen in FIG. 1, the dead time remains essentially constant while the real time from one pulse to the next decreases with increasing count rate. Dead-time correction serves to provide an estimate of the true physical count rate from the measured count rate.

Applied to a typical field of use, a QPMD might be used to measure the count rate of gamma-ray photons or beta particles from a radioactive material in a nuclear power plant, or the count rate of X-ray photons emitted by a sample in an electron microscope. In the former case, the rate of events can be related to a dose rate, typically measured in μSv, which must be monitored to ensure personnel are not exposed to radiation which would be hazardous to their health. This dose rate may form a part of the user's permanent record of radiation exposure, and must meet certain standards for accuracy that require dead-time correction. In the latter case, the rate of events is used directly as a measure proportional to the quantitative amount of a particular element present in a sample, which must be accurately measured in order to correctly identify the material. In both cases, it is possible for the input count rates to change by many orders of magnitude, resulting in very different amounts of dead-time correction.

In the literature, there are many well-documented schemes for performing dead-time correction (e.g., Gedcke-Hale and Lowe's) with varying degrees of accuracy by counting the amount of "elapsed dead time" (or its inverse, "elapsed live time") using high-speed clocks, with the accuracy limited by the duration of one clock cycle. These solutions typically use clocks that operate at 10 MHz and sometimes even 100 MHz or higher, in order to ensure accurate measurement. However, the power consumption of modern CMOS logic is largely proportional to its operating frequency. The total power, $P_{tot}$, may be measured as the sum of dynamic power $P_d$ and static power $P_s$. $P_s$ is typically stable except with changes in operating temperature, while $P_d$ can be obtained from the equation $P_d = k*V^2*f$, where V is the operating voltage, f is the frequency of switching (the "clock frequency") and k is a device-dependent constant with units of Farads. Thus it can be seen that a ten-fold increase in clock frequency from 10 MHz to 100 MHz results in a ten-fold increase in dynamic power, and therefore dynamic power is typically much larger than static power in an operating device. The dead-time correction approach described herein enables clock rates to be lowered to 10 kHz or less, for as much as a 1,000-fold savings in power consumption.

A requirement for low-power operation is increasingly driven by the need for portable, battery-powered devices. However, the standard solution for dead-time correction is not power-efficient. As a result, a technical problem exists in achieving dead-time correction with the minimum possible power consumption.

Figure 2:
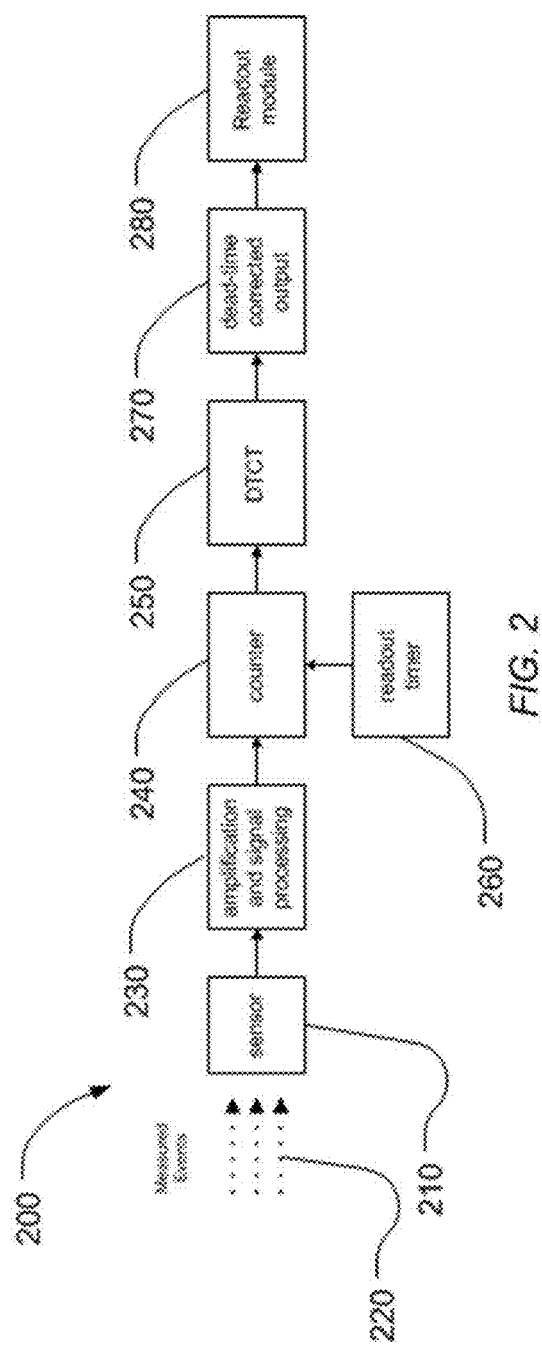
FIG. 2 is a schematic illustration of a dead-time correction system including a fixed clock frequency.

A simple low-power implementation of dead-time correction, known to those skilled in the art and illustrated in FIG. 2, is to provide a QPMD 200 comprising a sensor apparatus 210 which measures events 220, coupled to an amplifier 230 or comparable signal processing electronics that converts the sensor signal into a pulse with a known dead-time per pulse, coupled to a pulse counter 240 which increments on the occurrence of individual pulses, coupled to a dead-time correction system 250, wherein both the counter 240 and the dead-time correction system 250 operate from a very slow clock 260 operating at 10 kHz or less, thereby providing in combination a dead-time corrected output 270 to a readout module 280 with very low power consumption. In this implementation, the frequency with which the counter 240 is read and dead-time corrected can be as slow as 1 Hz, resulting in very low power consumption. However, the fixed frequency of this clock 260 (which defines a fixed time base, e.g. 1 second at 1 Hz clock frequency) introduces an additional technical problem.

In the high-power implementation, dead time is calculated and accumulated with each individual count. By contrast, the simple solution for dead-time correction outlined above corrects a plurality of counts measured over an interval defined by the time base, and requires the selection of a single time base. In other words, it is correcting a measured count rate rather than correcting an individual count. As a result, the statistical accuracy of the measurement of the count rate becomes important. For events which are Poisson-distributed in time (applicable to most quantized physical phenomena including radioactive decay, quantum re-emission, quantum tunneling, shot noise, etc.), the accuracy of count rate measurement improves as the number of counts increases; this can be achieved by either high count rates, or long time bases. For example, at a count rate of 1 cps, a period or time base of 100 seconds is required before a single count falls below a 1% measurement error (1 count out of 100). At a count rate of 100,000 cps, a period or time base of 1 ms is sufficient for the same 1% measurement error. But because a longer time base results in more averaging, short-term changes in rate are lost in the larger average. The magnitude of dead-time correction also increases with high count rates, and requires the count rates to be measured with more accuracy at higher rates. For example, with a 10 μs non-paralyzable dead-time, the dead-time correction is approximately 0.001% at 1 cps, and remains below 1% up to 1,000 cps, but increases to 10% at 10,000 cps and 50% at 100,000 cps.

Figure 3:
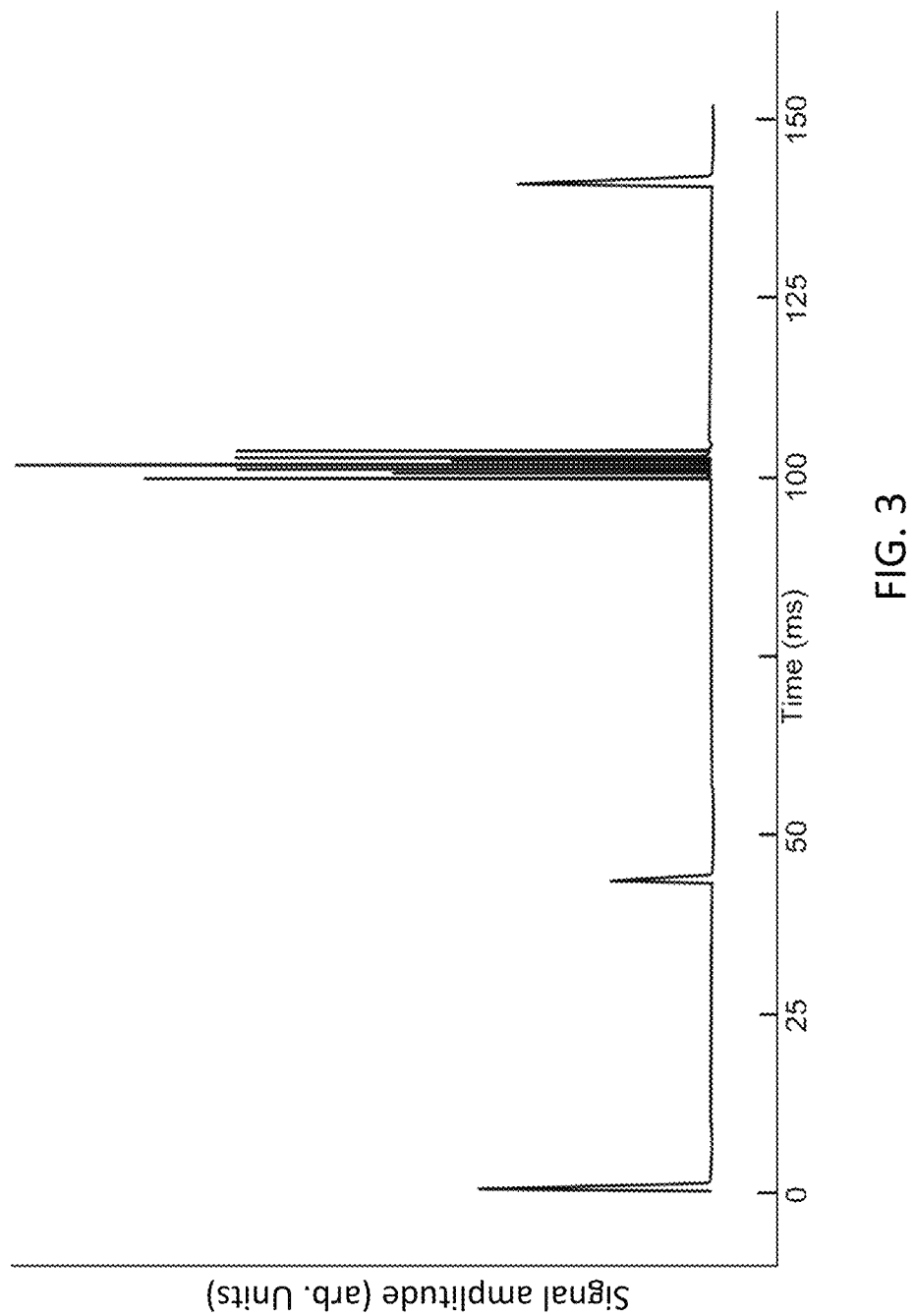
FIG. 3 a graph of signal intensity as a function of elapsed time that illustrates a 5 ms burst of 1,600 cps in a background of 25 cps.

There are many pulse measurements of interest where the count rate can change rapidly between low "background" rates and high "event-of-interest" rates, as illustrated in FIG. 3, where a 5 ms burst of 1,600 cps is shown starting at an elapsed time of 100 ms in a background of 25 cps. The photons emitted in bursts by radiation sources for nuclear medicine, or the back-scattered electron intensity from an electron beam scanning a sample, can change rate by several orders of magnitude almost instantaneously. If a long time-base is selected, the statistics for background count rates will be adequately accurate, but the dead-time correction applied to the whole interval can miss variations in count rate and thus grossly under-correct. Conversely, if a short time-base is selected, the variations in count rate can be seen, but the estimate of the count rate in each interval becomes highly inaccurate at background rates, i.e., most of the time. With a 1 second time base, 25 counts spread randomly throughout the interval can be reasonable estimated as 25 cps with no dead time correction needed, whereas with a 1 ms time base even a pair of counts within one interval (an unlikely event that will still occur by chance over 25,000 times per day) would be interpreted as a millisecond of 2,000 cps (inaccurately leading to dead time correction).

This situation presents an additional technical problem of keeping the time-base long enough to acquire adequate statistics, while also being able to measure short bursts of high count rate with accurate dead-time correction. The approach described herein addresses the combined technical problems of low-power dead-time correction and accuracy of correction for signals with large variations in count rate.

In one embodiment, a dead-time correction system for a pulse rate measurement device includes a first pulse counter having a selectable read-out rate, a second pulse counter operable at a read-out rate differing from that of the first pulse counter, a selection module in communication with the second pulse counter that selects the first pulse counter read-out rate in response to input from the second pulse counter, a multiplexer (MUX) in communication with the selection module, the MUX selecting from among at least two dead-time correction transforms (DTCT) based on the selected first pulse counter read-out rate, and a control-and-readout module in communication with the MUX that applies the selected DTCT to an uncorrected pulse count rate from the first pulse counter, to output a dead-time corrected pulse rate. The system can further include a first pulse counter read-out (PCRO) storage register that stores an immediately preceding PCRO count, and a subtractor module in communication with the first pulse counter and the PCRO storage register that subtracts the preceding PCRO count from the first pulse counter read-out count to output the uncorrected pulse count. The second pulse counter can have a read-out rate that is faster than all but the fastest selectable read-out rates of the first pulse counter.

Figure 4:
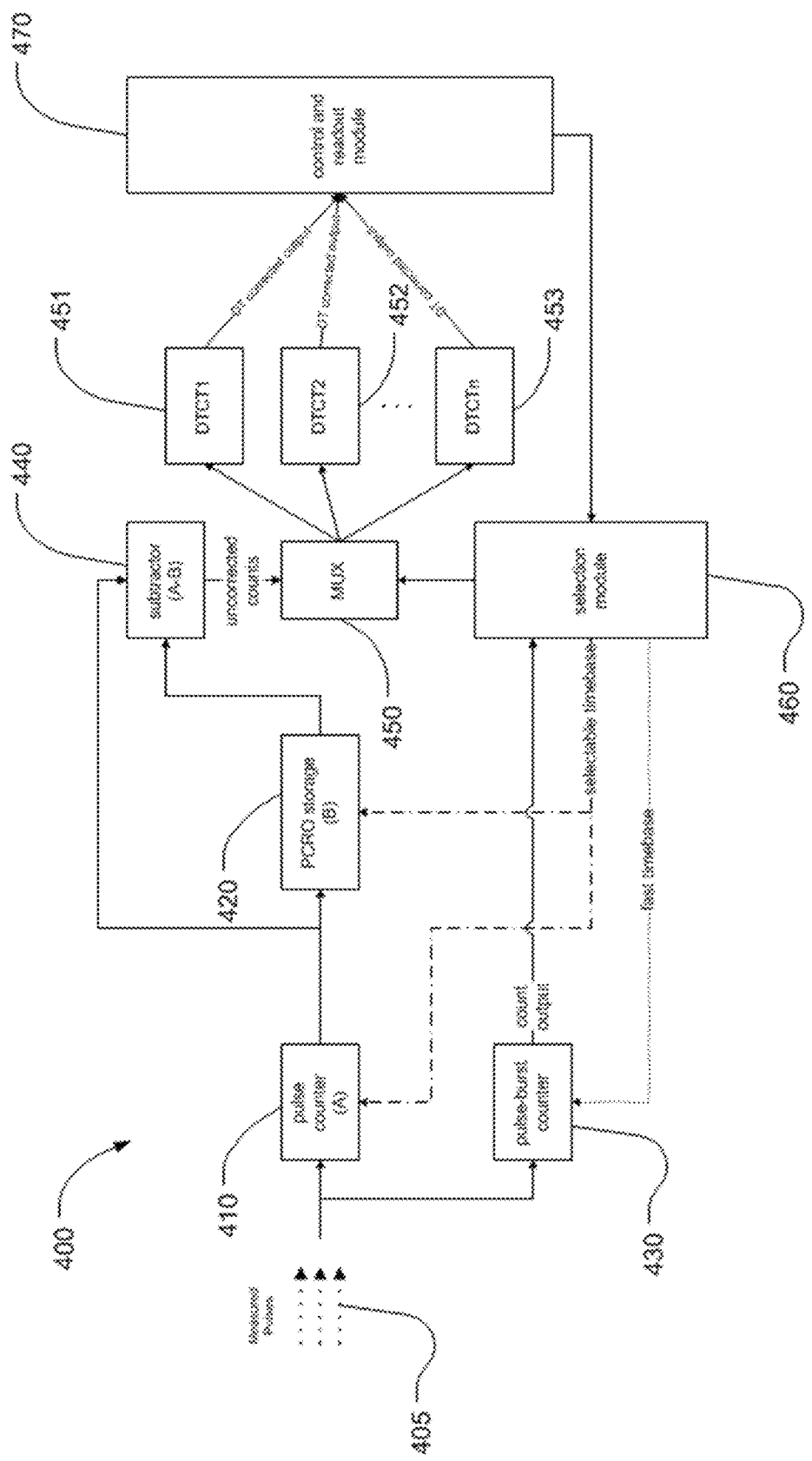
FIG. 4 is a schematic illustration of an exemplary embodiment of a dead-time correction system.

In another embodiment shown in FIG. 4, a dead-time correction system 400 for a pulse rate measurement device includes a pulse counter 410 that increments in response to pulses 405, the pulse counter 410 having a selectable pulse counter read-out rate, a pulse counter read-out (PCRO) storage register 420 that stores an immediately preceding PCRO count, and a pulse-burst counter 430 that also increments in response to pulses, the pulse-burst counter 430 having a pulse-burst counter read-out rate that is faster than all but the fastest selectable pulse counter read-out rate. The system 400 further includes a subtractor module 440 in electronic communication with the pulse counter 410 and the PCRO storage register 420 that subtracts the preceding PCRO count from the pulse counter read-out count to output an uncorrected pulse count, a selection module 460 in electronic communication with the pulse-burst counter 430 that selects the pulse counter read-out rate in response to input from the pulse-burst counter 430, a multiplexer (MUX) 450 in electronic communication with the subtractor module 440 and the selection module 460, the MUX 450 selecting from among at least two dead-time correction transforms (DTCT) 451, 452, . . . 453, the DTCT corresponding to the selected pulse counter read-out rate, and a control-and-readout module 470 in electronic communication with the MUX 450 that receives the corrected pulse rate obtained by applying the DTCT selected by the MUX 450 to the uncorrected pulse count divided by the pulse counter read-out rate to output a dead-time corrected pulse rate. The system 400 can further include an event sensor (not shown) that generates a pulse in response to an event, the event sensor having a known dead-time per event. The event sensor can further include an amplifier and signal processing electronics (not shown). In some embodiments, the event sensor can comprise a semiconductor crystal. In other embodiments, the event sensor can comprise a scintillating crystal. In still other embodiments, the event sensor can comprise a photo-conversion device.

In certain embodiments, the selectable pulse counter read-out rate can be in a range inclusive of between 1 Hz and 1 kHz, such as 1.25 Hz, 1.67 Hz, 2 Hz, 2.5 Hz, 3 Hz, 3.33 Hz, 4 Hz, 5 Hz, 7.5 Hz, 10 Hz, 12.5 Hz, 16.7 Hz, 20 Hz, 25 Hz, 30 Hz, 33.3 Hz, 40 Hz, 50 Hz, 100 Hz, 125 Hz, 167 Hz, 200 Hz, 250 Hz, 300 Hz, 333 Hz, 400 Hz, 500 Hz, 600 Hz, 750 Hz, and 800 Hz. The pulse-burst counter read-out rate can be in a range inclusive of between 100 Hz and 10 kHz, such as 200 Hz, 250 Hz, 300 Hz, 333 Hz, 400 Hz, 500 Hz, 600 Hz, 800 Hz, 1 kHz, 1.25 kHz, 1.67 kHz, 2 kHz, 2.5 kHz, 3 kHz, 3.33 kHz, 4 kHz, 5 kHz, 6 kHz, 7.5 kHz, and 8 kHz. In some embodiments, the selection module 460 can select the pulse counter read-out rate in response to input from the pulse-burst counter 430 and input from the control-and-readout module 470, such as an input from the control-and-readout module 470 to select the slowest selectable pulse counter read-out rate after a time interval (e.g., 30 s) without a recorded count.

As described above, these pulses 405 enter the dead-time correction system 400 and are coupled to the pulse counter 410 which increments on the occurrence of individual pulses (and which need not be periodically clocked), the readout of the pulse counter 410 occurring at a low frequency (typically 1 Hz to 1 kHz) according to a selectable time base. The pulses are additionally coupled to a smaller counter, the pulse-burst counter 430, which increments on the same pulses as the pulse counter 410, but which is always read out and cleared at a frequency (typically 100 Hz to 10 kHz) convertible to a time base that is faster than all but the fastest pulse counter selectable time base.

The selection module 460 produces both the fast time base and the selectable time base, and is coupled to the pulse-burst counter 430 and to the control-and-readout module 470, whose inputs determine the variable time base and control the MUX 450. The PCRO storage register 420 is also read out according to the selectable time base, and both the pulse counter 410 and the PCRO storage register 420 are coupled to a subtractor 440 which produces the uncorrected counts in the interval determined by the selectable time base by performing the subtraction (A−B). The MUX 450 is coupled to the subtractor 440 as its input, and using the control signal from the selection module 460, chooses which DTCT 451, 452, . . . 453 receives its output. The selected DTCT is used to compensate for dead time by reference to the uncorrected counts and the selectable time base, producing a dead-time corrected output pulse rate. This output is coupled to the control-and-readout module 470, which combines the dead-time-corrected readings for an application-specific use, such as converting the input count rate to units of absorbed dose (e.g., μSv) for an electronic dosimeter, or units of total counts per pixel for a sample analysis in an electron microscope.

The DTCT transforms the measured output count rate (OCR) into an estimate of the input count rate (ICR). Possible DTCTs include: a continuous equation that transforms OCR to ICR, such as the non-paralyzable dead-time equation $ICR=OCR/(1+\tau^*OCR)$, a look up table (LUT) that transforms the OCR to ICR with interpolation between table entries, as shown in Table 1.

TABLE 1

An exemplary look-up table (LUT)

| OCR | ICR |
|---|---|
| 0 | 0 |
| 1000 | 1010 |
| 6000 | 6382 |
| 15000 | 17647 |
| 22000 | 28205 |
| 33000 | 49253 |
| 47000 | 88679 |

Alternatively, a LUT can provide a value $K_n$ for each OCR (1, 2, 3, . . . n), such that $ICR=K_n^*OCR$, with interpolation of $K_n$ values between table entries, or a LUT can exhaustively enumerate a complete set of possible OCR measurements and the corresponding ICR for each OCR, such as a table of counts/ms OCR that can be exhaustively enumerated for rates from 0-99,000 cps, as such a table will have only 99 entries, and can be used to compensate for empirically measured semi-paralyzable dead-time that cannot easily be expressed in closed form.

Figure 5:
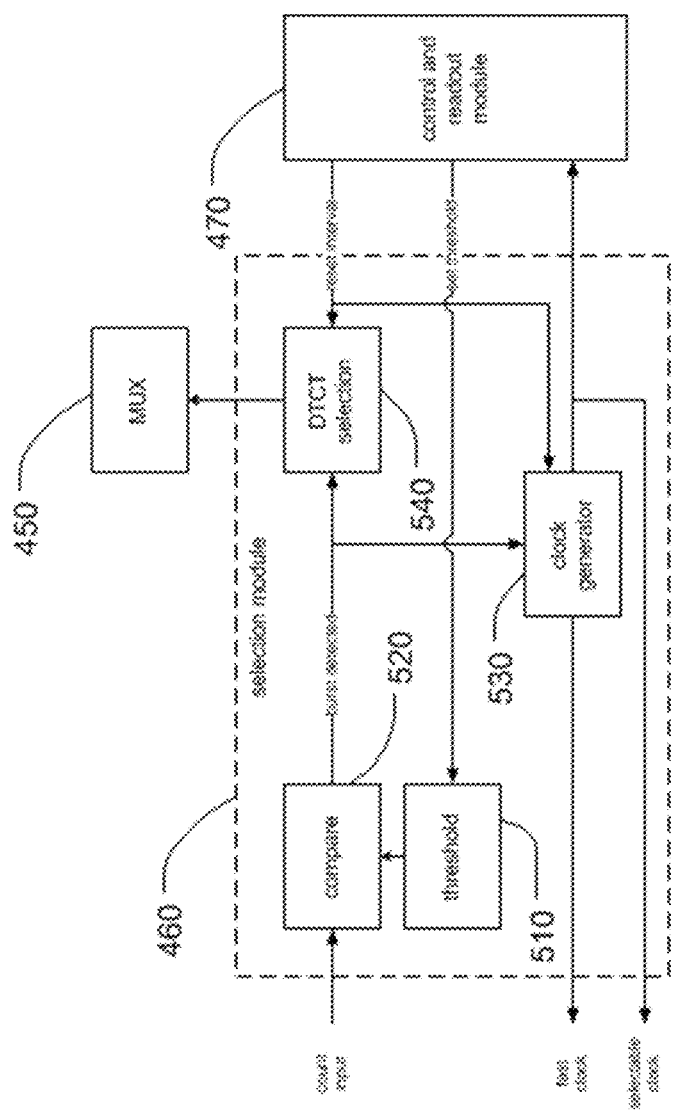
FIG. 5 is a schematic illustration of the selection module, MUX, and control-and-readout module shown in FIG. 4.

The selection module 460, shown in greater detail in FIG. 5, comprises a programmable threshold 510 (e.g., 5 counts) coupled to a compare block 520 that generates a "burst detected" signal when the pulse-burst counter (430 shown in FIG. 4) reaches the threshold within one of the fast intervals (typically 1 ms or less). The selection module 460 additionally comprises an interval timer 530 and a DTCT selection register 540, both of which can be changed by the burst detected signal, and both of which can be changed by the "reset interval" signal from the control and read-out module 470. Finally, the interval timer 530 provides a periodic "read counter" signal to the control-and-readout module 470, typically at frequencies in a range inclusive of between 1 Hz and 1 kHz, such as 1.25 Hz, 1.67 Hz, 2 Hz, 2.5 Hz, 3 Hz, 3.33 Hz, 4 Hz, 5 Hz, 7.5 Hz, 10 Hz, 12.5 Hz, 16.7 Hz, 20 Hz, 25 Hz, 30 Hz, 33.3 Hz, 40 Hz, 50 Hz, 100 Hz, 125 Hz, 167 Hz, 200 Hz, 250 Hz, 300 Hz, 333 Hz, 400 Hz, 500 Hz, 600 Hz, 750 Hz, and 800 Hz. This signal then controls how often the control and read-out module receives dead-time corrected values.

In a physical implementation, there are different ways to partition the functional blocks described above. In some embodiments, the pulse counter 410, pulse-burst counter 430, and selection module 460 can be implemented in a field programmable gate array (FPGA). In certain embodiments, the PCRO storage register 420, subtractor module 440, MUX 450, DTCTs 451, 452, . . . 453, and control-and-readout module 470 can be implemented in a general purpose micro-controller unit (MCU). In some embodiments, the aforementioned elements implemented in an FPGA can be combined with the aforementioned elements implemented in an MCU. In certain embodiments, the pulse counter 410, pulse-burst counter 430, and selection module 460 can be implemented in an application specific integrated circuit (ASIC). In some embodiments, all elements can be implemented in an FPGA. In other embodiments, all elements can be implemented in an MCU.

Figure 6:
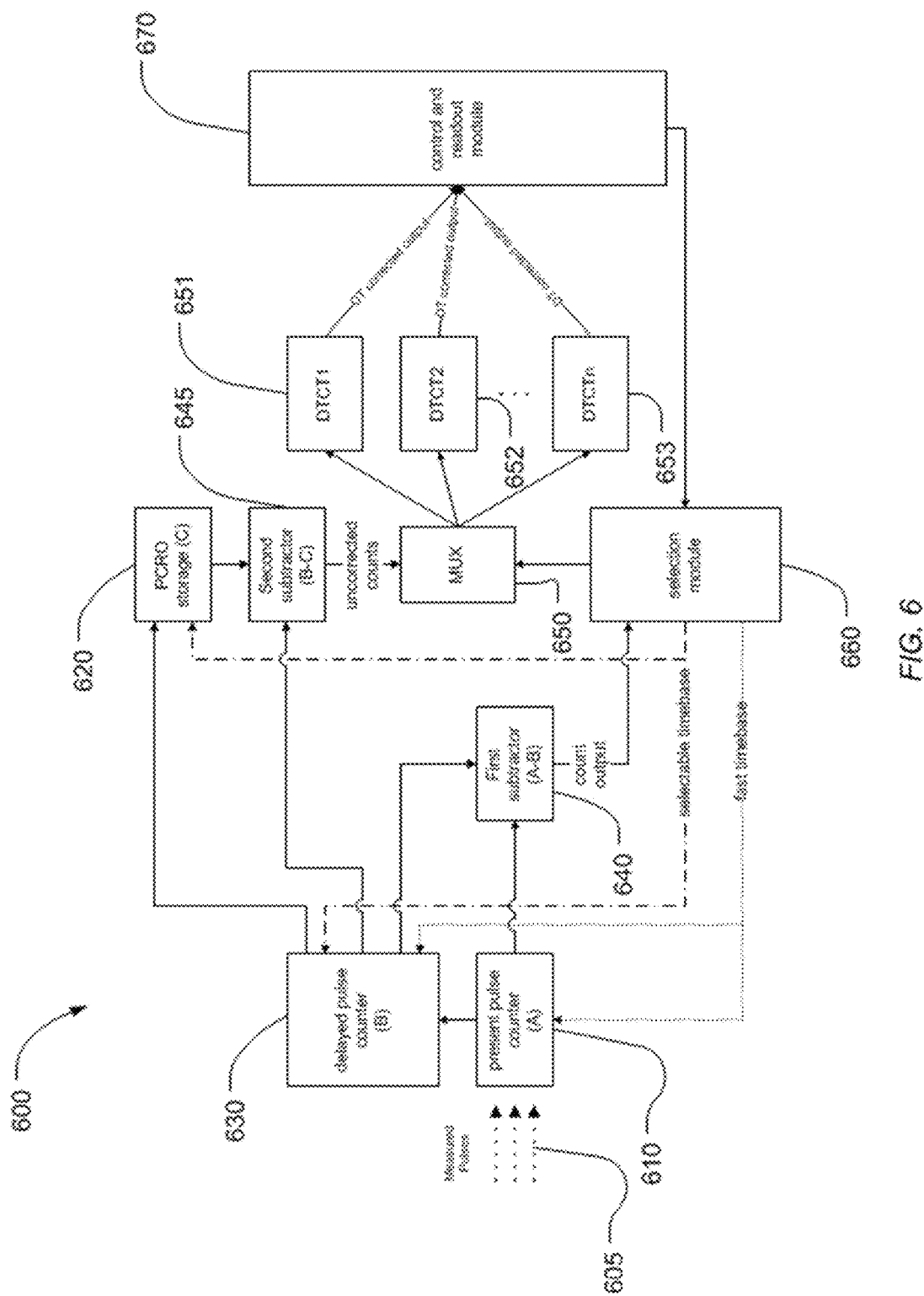
FIG. 6 is a schematic illustration of another exemplary embodiment of a dead-time correction system.

In another embodiment, shown in FIG. 6, a pipeline methodology enables the DTCT to be applied to the first instant of high-count-rate data. In this embodiment a dead-time correction system 600 for a pulse rate measurement device includes a present pulse counter 610 that increments in response to pulses 605, a delayed pulse counter 630 in electronic communication with the present pulse counter 610, the delayed pulse counter 630 capturing the immediately previous read-out from the present pulse counter 610 delayed by a single clock cycle at the present pulse counter read-out rate which is faster than all but the fastest selectable delayed pulse counter read-out rate. The system 600 further includes a pulse counter read-out (PCRO) storage register 620 in electronic communication with the delayed pulse counter 630, that stores the delayed pulse counter read-out at a selectable delayed pulse counter read-out rate. The system 600 also includes a first subtractor module 640 in electronic communication with the present pulse counter 610 and the delayed pulse counter 630 that outputs a difference between counts recorded by the present pulse counter 610 and the delayed pulse counter 630, a selection module 660 in electronic communication with the first subtractor module 640 that selects a new delayed pulse counter read-out rate based on the difference, a second subtractor module 645 in electronic communication with the delayed pulse counter 630 and the PCRO storage register 620 that subtracts the preceding PCRO storage register count from the delayed pulse counter read-out count to output an uncorrected pulse count, a multiplexer (MUX) 650 in electronic communication with the delayed pulse counter 630 and the selection module 660, the MUX 650 selecting from among at least two dead-time correction transforms (DTCT) 651, 652, . . . 653, the DTCT corresponding to the selected delayed pulse counter read-out rate, and a control-and-readout module 670 in electronic communication with the MUX 650 that applies the DTCT selected by the MUX 650 to the uncorrected pulse count divided by the selected delayed pulse counter read-out rate to output a dead-time corrected pulse rate. The system 600 can further include an event sensor (not shown) that generates a pulse in response to an event, the event sensor having a known dead-time per event. The event sensor can further include an amplifier and signal processing electronics (not shown). In some embodiments, the event sensor can comprise a semiconductor crystal. In other embodiments, the event sensor can comprise a scintillating crystal. In still other embodiments, the event sensor can comprise a photo-conversion device.

In certain embodiments, the selectable delayed pulse counter read-out rate can be in a range inclusive of between 1 Hz and 1 kHz, such as 1.25 Hz, 1.67 Hz, 2 Hz, 2.5 Hz, 3 Hz, 3.33 Hz, 4 Hz, 5 Hz, 7.5 Hz, 10 Hz, 12.5 Hz, 16.7 Hz, 20 Hz, 25 Hz, 30 Hz, 33.3 Hz, 40 Hz, 50 Hz, 100 Hz, 125 Hz, 167 Hz, 200 Hz, 250 Hz, 300 Hz, 333 Hz, 400 Hz, 500 Hz, 600 Hz, 750 Hz, and 800 Hz. The clock cycle for the present pulse counter 610 can be in a range inclusive of between 100 Hz and 10 kHz, such as 200 Hz, 250 Hz, 300 Hz, 333 Hz, 400 Hz, 500 Hz, 600 Hz, 800 Hz, 1 kHz, 1.25 kHz, 1.67 kHz, 2 kHz, 2.5 kHz, 3 kHz, 3.33 kHz, 4 kHz, 5 kHz, 6 kHz, 7.5 kHz, and 8 kHz. In some embodiments, the selection module 660 can select the delayed pulse counter read-out rate in response to input from the first subtractor module 640 and input from the control-and-readout module 670, such as an input from the control-and-readout module 670 to select the slowest selectable delayed pulse counter read-out rate after a time interval (e.g., 30 s) without a recorded count.

In the embodiment shown in FIG. 6, the pulse input 605 is coupled to the present pulse counter 610, whose read out occurs at the fast time base into both the delayed pulse counter 630 and first subtractor 640. Likewise, the delayed pulse counter 630 is also read into the first subtractor 640, which computes the difference of these two values (A−B), a count output which is then coupled to the selection module 660. Additionally, a delayed event counter readout at the selectable time base is coupled to the PCRO storage register 620, which in turn is read out at the selectable time base and coupled into second subtractor 645. Second subtractor 645 then computes the uncorrected counts in the interval determined by the selectable time base by performing the subtraction (B−C). From this point, the data are coupled through the MUX 650, the selected DTCT 651, 652, . . . 653, and into the control and read-out module 670 that receives the corrected pulse rate obtained by applying the DTCT selected by the MUX 650 to the uncorrected pulse count divided by the selectable time base to output a dead-time corrected pulse rate.

The single-cycle of delay introduced by the delayed pulse counter 630 according to the fast time base is typically 10 ms or less, meaning that the real-time response of the system 600 is not compromised from the perspective of human reaction times. However, in this case, the slightly older counts data in the delayed pulse counter 630 is known to precede the increase in count rate, and so the change in the selection module 660 is applied before the data for that interval is processed and therefore enables the selected dead-time correction to take effect immediately. This methodology is thus applicable to systems where very fast transitions must be detected and dead-time corrected.

In a physical implementation, there are different ways to partition the functional blocks described above. In some embodiments, the present pulse counter 610, delayed pulse counter 630, first subtractor module 640, and selection module 660 can be implemented in a field programmable gate array (FPGA). In other embodiments, the PCRO storage register 620, second subtractor module 645, MUX 650, DTCTs 651, 652, . . . 653, and control-and-readout module 670 can be implemented in a general purpose micro-controller unit (MCU). In still other embodiments, the aforementioned elements implemented in an FPGA can be combined with the aforementioned elements implemented in an MCU. In certain embodiments, the present pulse counter 610, delayed pulse counter 630, first subtractor module 640, and selection module 660 can be implemented in an application specific integrated circuit (ASIC). In some embodiments, all elements can be implemented in an FPGA. In other embodiments, all elements can be implemented in an MCU.

Figure 7B:
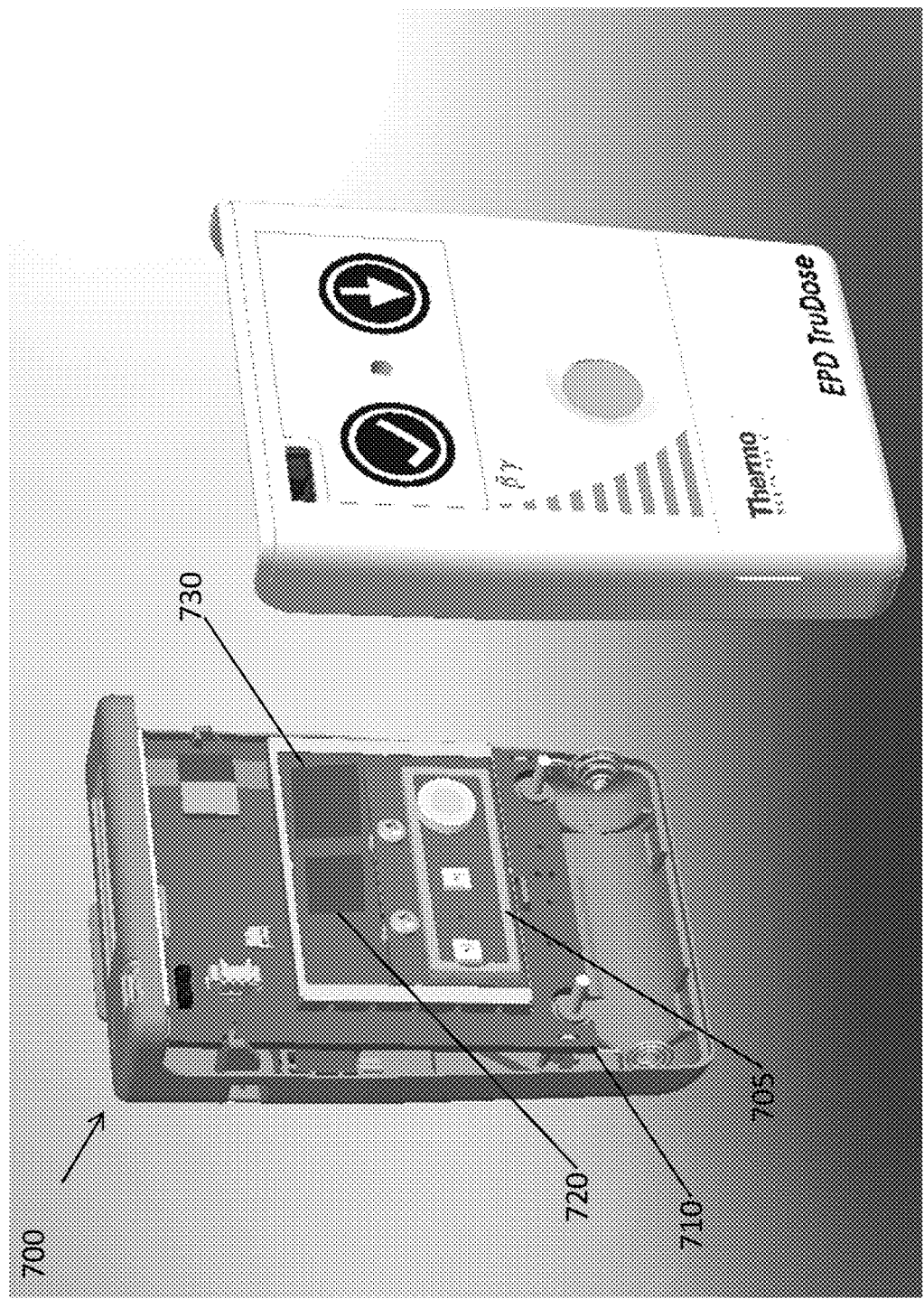

In another embodiment shown in FIGS. 7A and 7B, an electronic dosimeter 700 includes a plurality of PiN diode radiation detectors 705 that generate pulses in response to radiation detection events, in electronic communication with signal processing circuitry, the radiation detectors 705 and signal processing circuitry having a known combined dead-time per radiation detection event. The electronic dosimeter 700 includes a dead-time correction system 710 as described above, with elements implemented in a field programmable gate array (FPGA) 720 and elements implemented in a general purpose micro controller unit (MCU) 730.

In yet another embodiment, a method of correcting for dead-time of a pulse rate measurement device includes operating at least a first and second pulse counters at different read-out rates, selecting a read-out rate of the first pulse counter in response to input from the second pulse counter, selecting from among at least two dead-time correction transforms (DTCT) based on the selected first pulse counter read-out rate, and applying the selected DTCT to an uncorrected pulse count rate from the first pulse counter, to output a dead-time corrected pulse rate. The method can include storing an immediately preceding read-out count from the first pulse counter, and subtracting the preceding pulse counter read-out count from the first pulse counter read-out count, to output the uncorrected pulse count. The second pulse counter can have a read-out rate that is faster than all but the fastest selectable read-out rates of the first pulse counter.

Figure 8:
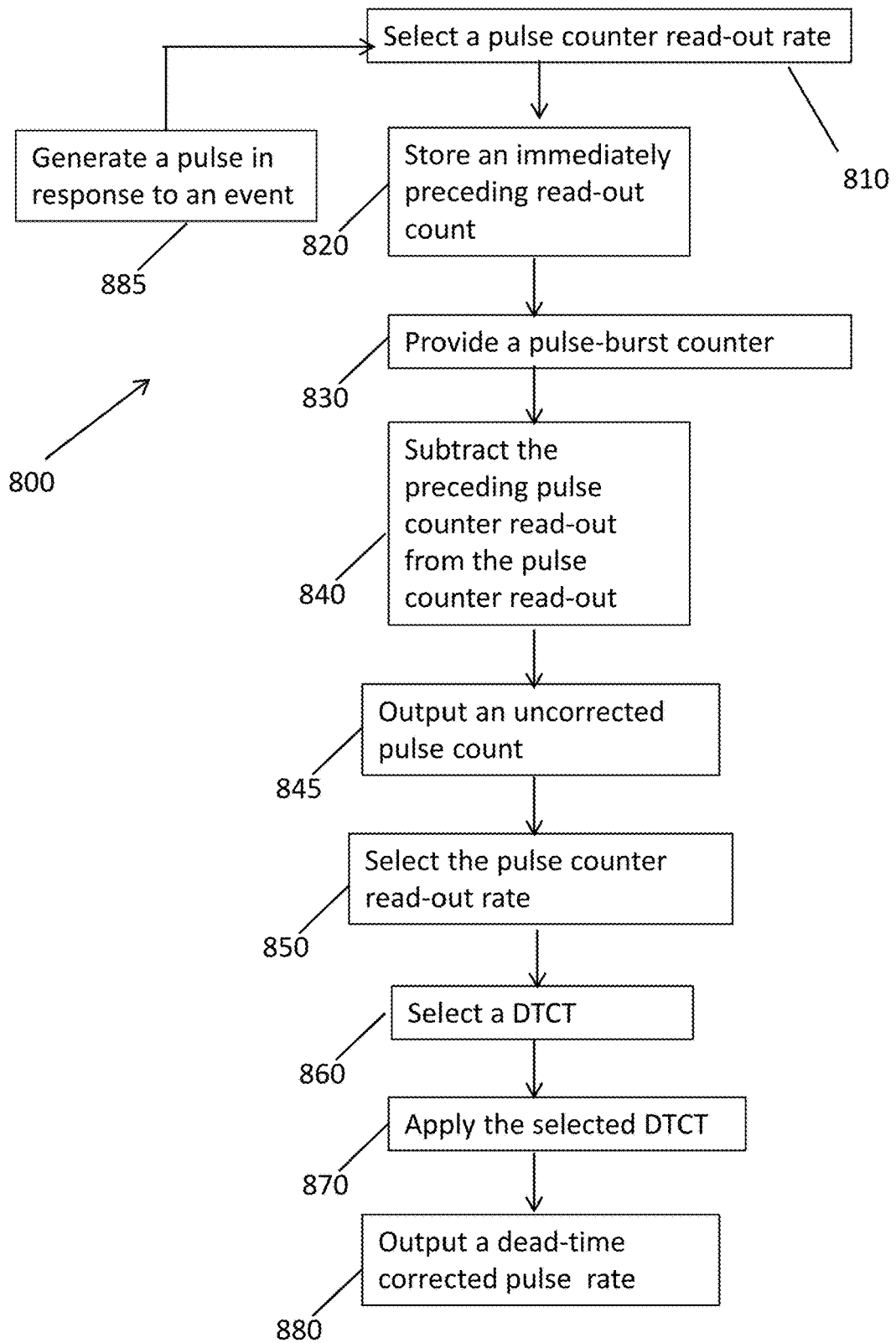
FIG. 8 is a flowchart of an exemplary method of correcting for dead-time of a pulse rate measurement device.

In still another embodiment shown in FIG. 8, a method 800 of correcting for dead-time of a pulse rate measurement device includes selecting at step 810 a pulse counter read-out rate for a pulse counter that increments in response to pulses, storing at step 820 an immediately preceding read-out count from the pulse counter, providing at step 830 a pulse-burst counter that also increments in response to pulses, the pulse-burst counter having a pulse-burst counter read-out rate that is faster than all but the fastest selectable pulse counter read-out rate, and subtracting at step 840 the preceding pulse counter read-out count from the pulse counter read-out count to output at step 845 an uncorrected pulse count. The method further includes selecting at step 850 the pulse counter read-out rate in response to input from the pulse-burst counter, selecting at step 860 from among at least two dead-time correction transforms (DTCT), the DTCT corresponding to the selected pulse counter read-out rate, and applying at step 870 the DTCT to the uncorrected pulse count divided by the pulse counter read-out rate to output at step 880 a dead-time corrected pulse rate. The method can further include generating at step 885 a pulse in response to an event. The selectable pulse counter read-out rate can be in a range inclusive of between 1 Hz and 1 kHz, such as 1.25 Hz, 1.67 Hz, 2 Hz, 2.5 Hz, 3 Hz, 3.33 Hz, 4 Hz, 5 Hz, 7.5 Hz, 10 Hz, 12.5 Hz, 16.7 Hz, 20 Hz, 25 Hz, 30 Hz, 33.3 Hz, 40 Hz, 50 Hz, 100 Hz, 125 Hz, 167 Hz, 200 Hz, 250 Hz, 300 Hz, 333 Hz, 400 Hz, 500 Hz, 600 Hz, 750 Hz, and 800 Hz. The pulse-burst counter read-out rate can be in a range inclusive of between 100 Hz and 10 kHz, such as 200 Hz, 250 Hz, 300 Hz, 333 Hz, 400 Hz, 500 Hz, 600 Hz, 800 Hz, 1 kHz, 1.25 kHz, 1.67 kHz, 2 kHz, 2.5 kHz, 3 kHz, 3.33 kHz, 4 kHz, 5 kHz, 6 kHz, 7.5 kHz, and 8 kHz.

Figure 9:
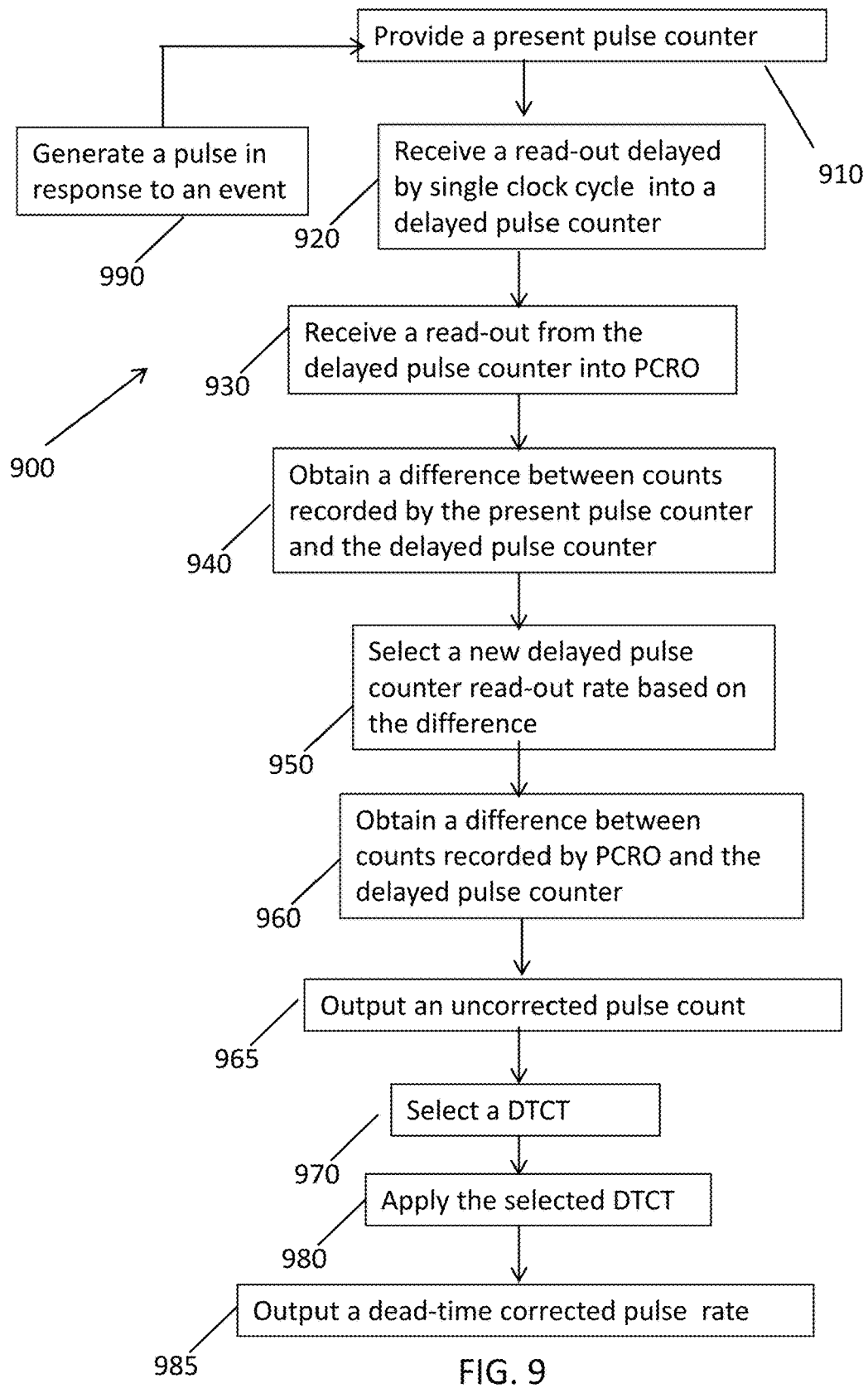
FIG. 9 is a flowchart of another exemplary method of correcting for dead-time of a pulse rate measurement device.

In yet another embodiment shown in FIG. 9, a method 900 of correcting for dead-time of a pulse rate measurement device includes providing at step 910 a present pulse counter that increments in response to pulses, receiving at step 920 a read-out from the present pulse counter delayed by a single clock cycle of the present pulse counter in a delayed pulse counter in electronic communication with the present pulse counter, receiving at step 930 a read-out from the delayed pulse counter into a pulse counter read-out (PCRO) storage register at a selectable delayed pulse counter read-out rate, and obtaining at step 940 a difference between counts recorded by the present pulse counter and the delayed pulse counter. The method further includes selecting at step 950 a new delayed pulse counter read-out rate based on the difference, obtaining at step 960 a difference between counts recorded by the PCRO storage register and the delayed pulse counter to output at step 965 an uncorrected pulse count, selecting at step 970 from among at least two dead-time correction transforms (DTCT), the DTCT corresponding to the selected delayed pulse counter read-out rate, and applying at step 980 the DTCT to the uncorrected pulse count divided by the selected delayed pulse counter read-out rate to output at step 985 a dead-time corrected pulse rate. The method can further include generating at step 990 a pulse in response to an event. The selectable delayed pulse counter read-out rate can be in a range inclusive of between 1 Hz and 1 kHz, such as 1.25 Hz, 1.67 Hz, 2 Hz, 2.5 Hz, 3 Hz, 3.33 Hz, 4 Hz, 5 Hz, 7.5 Hz, 10 Hz, 12.5 Hz, 16.7 Hz, 20 Hz, 25 Hz, 30 Hz, 33.3 Hz, 40 Hz, 50 Hz, 100 Hz, 125 Hz, 167 Hz, 200 Hz, 250 Hz, 300 Hz, 333 Hz, 400 Hz, 500 Hz, 600 Hz, 750 Hz, and 800 Hz. The clock cycle for the present pulse counter can be in a range inclusive of between 100 Hz and 10 kHz, such as 200 Hz, 250 Hz, 300 Hz, 333 Hz, 400 Hz, 500 Hz, 600 Hz, 800 Hz, 1 kHz, 1.25 kHz, 1.67 kHz, 2 kHz, 2.5 kHz, 3 kHz, 3.33 kHz, 4 kHz, 5 kHz, 6 kHz, 7.5 kHz, and 8 kHz.

While the present invention has been illustrated by a description of exemplary embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A dead-time correction system for a pulse rate measurement device, the system comprising:
   a. a pulse counter that increments in response to pulses, the pulse counter having a selectable pulse counter read-out rate;
   b. a pulse counter read-out (PCRO) storage register that stores an immediately preceding PCRO count;
   c. a pulse-burst counter that also increments in response to pulses, the pulse-burst counter having a pulse-burst counter read-out rate that is faster than all but the fastest selectable pulse counter read-out rate;
   d. a subtractor module in electronic communication with the pulse counter and the PCRO storage register that subtracts the preceding PCRO count from the pulse counter read-out count to output an uncorrected pulse count;
   e. a selection module in electronic communication with the pulse-burst counter that selects the pulse counter read-out rate in response to input from the pulse-burst counter;
   f. a multiplexer (MUX) in electronic communication with the subtractor module and the selection module, the MUX selecting from among at least two dead-time correction transforms (DTCT), the DTCT corresponding to the selected pulse counter read-out rate; and g. a control-and-readout module in electronic communication with the MUX that applies the DTCT selected by the MUX to the uncorrected pulse count divided by the pulse counter read-out rate to output a dead-time corrected pulse rate.

2. The system of claim 1, further including an event sensor comprising an amplifier and signal processing electronics that generates a pulse in response to an event, the event sensor having a known dead-time per event.

3. The system of claim 2, wherein the event sensor comprises a semiconductor crystal, a scintillating crystal, or a photo-conversion device.

4. The system of claim 1, wherein the selectable pulse counter read-out rate is in a range of between 1 Hz and 1 kHz.

5. The system of claim 1, wherein the pulse-burst counter read-out rate is in a range of between 100 Hz and 10 kHz.

6. The system of claim 1, wherein the selection module selects the pulse counter read-out rate in response to input from the pulse-burst counter and input from the control-and-readout module.

7. The system of claim 1, wherein the DTCT is one of an equation and a look-up table (LUT).

8. The system of claim 7, wherein the equation is a function of the uncorrected pulse count supplied by the subtractor.

9. The system of claim 7, wherein the LUT is one of a LUT that transforms output count rate into input count rate with interpolation between table entries, a LUT that provides a conversion constant for each output count rate, with interpolation between table entries, and a LUT that enumerates a complete set of output count rates and corresponding input count rates.

10. The system of claim 1, wherein the pulse counter, pulse-burst counter, and selection module are implemented in a field programmable gate array (FPGA).

11. The system of claim 1, wherein the PCRO storage register, subtractor module, MUX, DTCTs, and control-and-readout module are implemented in a general purpose micro-controller unit (MCU).

12. The system of claim 1, wherein the pulse counter, pulse-burst counter, and selection module are implemented in an application specific integrated circuit (ASIC).

13. The system of claim 1, wherein elements a-g are implemented in a field programmable gate array (FPGA).

14. The system of claim 1, wherein elements a-g are implemented in a general purpose micro-controller unit (MCU).

15. A method of correcting for dead-time of a pulse rate measurement device, the method comprising:
a. selecting a pulse counter read-out rate for a pulse counter that increments in response to pulses;
b. storing an immediately preceding read-out count from the pulse counter;
c. providing a pulse-burst counter that also increments in response to pulses, the pulse-burst counter having a pulse-burst counter read-out rate that is faster than all but the fastest selectable pulse counter read-out rate;
d. subtracting the preceding pulse counter read-out count from the pulse counter read-out count to output an uncorrected pulse count;
e. selecting the pulse counter read-out rate in response to input from the pulse-burst counter;

f. selecting from among at least two dead-time correction transforms (DTCT), the DTCT corresponding to the selected pulse counter read-out rate; and
g. applying the DTCT to the uncorrected pulse count divided by the pulse counter read-out rate to output a dead-time corrected pulse rate.

16. The method of claim 15, further including generating a pulse in response to an event.

17. The method of claim 15, wherein the selectable pulse counter read-out rate is in a range of between 1 Hz and 1 kHz.

18. The method of claim 15, wherein the pulse-burst counter read-out rate is in a range of between 100 Hz and 10 kHz.

19. An electronic dosimeter comprising:
a. a radiation detector that generates a pulse in response to a radiation detection event, the radiation detector having a known dead-time per radiation detection event;
b. a pulse counter that increments in response to pulses, the pulse counter having a selectable pulse counter read-out rate;
c. a pulse counter read-out (PCRO) storage register that stores an immediately preceding PCRO count;
d. a pulse-burst counter that also increments in response to pulses, the pulse-burst counter having a pulse-burst counter read-out rate that is faster than all but the fastest selectable pulse counter read-out rate;
e. a subtractor module in electronic communication with the pulse counter and the PCRO storage register that subtracts the preceding PCRO storage register count from the pulse counter read-out count to output an uncorrected pulse count;
f. a selection module in electronic communication with the pulse-burst counter that selects the pulse counter read-out rate in response to input from the pulse-burst counter;
g. a multiplexer (MUX) in electronic communication with the subtractor module and the selection module, the MUX selecting from among at least two dead-time correction transforms (DTCT), the DTCT corresponding to the selected pulse counter read-out rate; and
h. a control-and-readout module in electronic communication with the MUX that applies the DTCT selected by the MUX to the uncorrected pulse count divided by the pulse counter read-out rate to output a dead-time corrected pulse rate.

20. A method of correcting for dead-time of a pulse rate measurement device, the method comprising:
a. operating at least a first and second pulse counters at different read-out rates;
b. selecting a read-out rate of the first pulse counter in response to input from the second pulse counter;
c. selecting from among at least two dead-time correction transforms (DTCT) based on the selected first pulse counter read-out rate; and
d. applying the selected DTCT to an uncorrected pulse count rate from the first pulse counter, to output a dead-time corrected pulse rate.

21. The method of claim 20, wherein operating the first pulse counter comprises:
storing an immediately preceding read-out count from the first pulse counter; and
subtracting the preceding pulse counter read-out count from the first pulse counter read-out count, to output the uncorrected pulse count.

22. The method of claim 21, wherein the second pulse counter has a read-out rate that is faster than all but the fastest selectable read-out rates of the first pulse counter.

23. A dead-time correction system for a pulse rate measurement device, the system comprising:
   a. a first pulse counter having a selectable read-out rate;
   b. a second pulse counter operable at a read-out rate differing from that of the first pulse counter;
   c. a selection module in communication with the second pulse counter that selects the first pulse counter read-out rate in response to input from the second pulse counter;
   d. a multiplexer (MUX) in communication with the selection module, the MUX selecting from among at least two dead-time correction transforms (DTCT) based on the selected first pulse counter read-out rate; and
   e. a control-and-readout module in communication with the MUX that applies the selected DTCT to an uncorrected pulse count rate from the first pulse counter, to output a dead-time corrected pulse rate.

24. The dead-time correction system of claim 23, further including a first pulse counter read-out (PCRO) storage register that stores an immediately preceding PCRO count, and a subtractor module in communication with the first pulse counter and the PCRO storage register that subtracts the preceding PCRO count from the first pulse counter read-out count to output the uncorrected pulse count.

25. The dead-time correction system of claim 24, wherein the second pulse counter has a read-out rate that is faster than all but the fastest selectable read-out rates of the first pulse counter.

* * * * *